United States Patent
Yang et al.

(10) Patent No.: US 12,100,595 B2
(45) Date of Patent: Sep. 24, 2024

(54) AMORPHOUS SILICON-BASED SCAVENGING AND SEALING EOT

(71) Applicant: Applied Materials, Inc., Santa Clara, CA (US)

(72) Inventors: Yong Yang, Tengzhou (CN); Jacqueline S. Wrench, San Jose, CA (US); Yixiong Yang, Fremont, CA (US); Jianqiu Guo, San Jose, CA (US); Seshadri Ganguli, Sunnyvale, CA (US); Steven C. H. Hung, Sunnyvale, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 282 days.

(21) Appl. No.: 17/347,786

(22) Filed: Jun. 15, 2021

(65) Prior Publication Data

US 2022/0254640 A1 Aug. 11, 2022

Related U.S. Application Data

(60) Provisional application No. 63/194,628, filed on May 28, 2021, provisional application No. 63/147,217, filed on Feb. 8, 2021.

(51) Int. Cl.
*H01L 21/28* (2006.01)
*H01L 29/49* (2006.01)
(Continued)

(52) U.S. Cl.
CPC .... *H01L 21/28185* (2013.01); *H01L 29/4983* (2013.01); *H01L 29/518* (2013.01); *H01L 29/66545* (2013.01)

(58) Field of Classification Search
CPC .......... H01L 21/28185; H01L 29/4983; H01L 29/518; H01L 29/66545
See application file for complete search history.

(56) References Cited

U.S. PATENT DOCUMENTS

| | | | |
|---|---|---|---|
| 7,489,545 B2* | 2/2009 | Forbes | H10B 43/30 365/185.05 |
| 10,319,846 B1* | 6/2019 | Ando | H01L 29/4958 |

(Continued)

OTHER PUBLICATIONS

PCT International Search Report and Written Opinion in PCT/US2022/031236 dated Sep. 14, 2022, 9 pages.

*Primary Examiner* — Monica D Harrison
*Assistant Examiner* — Andre C Stevenson
(74) *Attorney, Agent, or Firm* — SERVILLA WHITNEY LLC

(57) ABSTRACT

A sacrificial sealing layer is formed on a high-κ metal gate (HKMG) stack to suppress oxidants, e.g., oxygen and water, from impacting the metal gate stack, thus preserving the device EOT. The method integrated processes that include forming an interfacial layer on the substrate; forming a high-κ metal oxide layer on the interfacial layer, the high-κ metal oxide layer comprising a dipole region adjacent to the interfacial layer, the dipole region; depositing a capping layer on the high-κ metal oxide layer; and forming a sacrificial sealing layer on the capping layer. The dipole region is formed by driving a dopant species, e.g., zinc (Zn), vanadium (V), tungsten (W), molybdenum (Mo), ruthenium (Ru), titanium (Ti), tantalum (Ta), zirconium (Zr), aluminum (Al), niobium (Nb), or mixtures thereof, of a dipole film into the high-κ metal oxide layer to form a dipole region.

19 Claims, 4 Drawing Sheets

(51) Int. Cl.
  *H01L 29/51*   (2006.01)
  *H01L 29/66*   (2006.01)

(56) References Cited

U.S. PATENT DOCUMENTS

| | | |
|---|---|---|
| 10,825,736 B1 | 11/2020 | Zhang et al. |
| 2009/0302369 A1 | 12/2009 | Guha et al. |
| 2012/0038009 A1 | 2/2012 | Toh et al. |
| 2012/0104506 A1 | 5/2012 | Wang et al. |
| 2015/0255463 A1* | 9/2015 | Ando .................... H01L 21/225 |
| | | 438/587 |
| 2019/0198629 A1* | 6/2019 | Yeung ............... H01L 29/78681 |
| 2020/0119164 A1 | 4/2020 | Tsau et al. |
| 2021/0098581 A1 | 4/2021 | Lin et al. |

* cited by examiner

AMORPHOUS SILICON-BASED SCAVENGING AND SEALING EOT

CROSS-REFERENCE TO RELATED APPLICATIONS

This application claims priority to U.S. Provisional Application No. 63/147,217, filed Feb. 8, 2021, and to U.S. Provisional Application No. 63/194,628, filed May 28, 2021, the entire disclosures of which are hereby incorporated by reference herein.

TECHNICAL FIELD

Embodiments of the present disclosure generally relate to suppressing oxidants (e.g., oxygen atoms) from impacting metal gate stacks. In particular embodiments, a sacrificial sealing layer is formed on a high-κ metal gate (HKMG) stack, the high-κ metal gate stack including a high-κ metal oxide layer comprising a dipole region.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

As device dimensions have shrunk, device geometries and materials have experienced difficulty maintaining switching speeds without incurring failures. Several new technologies have emerged that allow chip designers to continue shrinking device dimensions. Control of the dimensions of device structure is a key challenge for present and future technology generations.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET. A gate electrode is part of an integrated circuit. For example, a MOSFET comprises a gate structure disposed between source and drain regions that are formed in the semiconductor substrate. The gate structure or stack generally comprises a gate electrode and a gate dielectric. The gate electrode is disposed over the gate dielectric to control a flow of charge carriers in a channel region that is formed between drain and source regions beneath the gate dielectric.

Fabrication friendly metals with electronegativity greater than hafnium (Hf), 1.3) such as aluminum (Al, 1.61), niobium (Nb, 1.6), titanium (Ti, 1.54), and tantalum (Ta, 1.5) can induce dipoles favoring PMOS. To achieve the desired dipole effect, the desired element is driven from a deposited film with spike anneal and removed after drive in. The spike anneal can potentially cause an equivalent oxide thickness (EOT) penalty because free oxygen atoms in the gate dielectric layers and the overlaying dipole stack diffuse downward to oxidize the underlying silicon layer.

Accordingly, methods of preventing an equivalent oxide thickness penalty are needed.

SUMMARY

One or more embodiments of the disclosure are directed to a method of forming a metal gate stack. In one or more embodiments, a method of forming a metal gate stack comprises: forming an interfacial layer on a surface of a substrate; depositing a high-κ metal oxide layer on the interfacial layer; forming a dipole film on the high-κ metal oxide layer; depositing a first capping layer on the substrate; forming a sacrificial sealing layer on the first high-κ metal oxide capping layer; exposing the substrate to a thermal treatment at a temperature of at least 700° C. to drive the dipole film into the high-κ metal oxide layer and to form a dipole region; and removing the sacrificial sealing layer.

Additional embodiments of the disclosure are directed to a method of scavenging oxidants from a metal gate stack. In one or more embodiments, the method comprises: forming a sacrificial sealing layer on a metal gate stack, the metal gate stack comprising a first capping layer on a dipole film on high-κ metal oxide layer on an interfacial layer on a surface of a substrate; exposing the metal gate stack to a thermal treatment at a temperature of at least 700° C. to drive the dipole film into the high-κ metal oxide layer and to form a dipole region; and removing the sacrificial sealing layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
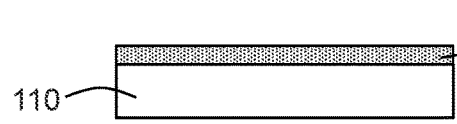
FIGS. 1A to 1G are cross-sectional views of a metal gate stack in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Embodiments of the present disclosure advantageously provide methods of preventing an as-deposited dipole film from being oxidized. In one or more embodiments, a sealing layer is deposited on a top surface a gate stack, and the gate stack is then annealed to drive the dipole element into cap layer and the high-k layer. Without intending to be bound by theory, it is thought that the sealing layer is able to scavenge extra oxidants (e.g., oxygen atoms, water, and the like) from the high-κ layer, minimizing equivalent oxide thickness (EOT) increase. After annealing, the sealing layer is removed, and the resulting gate stack is subjected to post-processing.

The gate stack can comprise one or more of a gate dielectric or high-κ metal oxide layer having a dipole region, a capping layer, and a metal gate work function layer. The dipole region may be in the high-κ metal oxide layer adjacent to an interfacial layer.

Equivalent oxide thickness (EOT) provides a characteristic of the interfacial layer and high-κ layer. Experiments directed to equivalent oxide thickness (EOT) for Nb-containing dipole regions showed that depositing a sealing capping layer on a metal gate state results in no EOT penalty (<~0.2 Å). In an experiment, a sealing layer comprising amorphous silicon having a thickness in a range of from 5 Å to 40 Å was deposited by atomic layer deposition on a metal gate stack. The dipole stack included a dipole film (e.g., niobium nitride (NbN) or titanium aluminum nitride (TiAlN)) on a high-κ metal oxide layer comprising hafnium oxide ($HfO_2$), which was located on an interfacial layer of $SiO_2$ on a substrate. A TiN capping layer was deposited in situ on the dipole film using ALD. After the deposition of the amorphous silicon sealing layer, the dipole film was driven into the high-κ metal oxide layer by a thermal treatment at a substrate temperature of at least 700° C.

One or more embodiments of the present disclosure provide devices and methods of formation that are particularly useful in forming positive metal oxide semiconductor (PMOS) integrated-circuit devices and will be described in that context. Other devices and applications are also within the scope of the invention.

FIGS. 1A to 1F illustrate cross sectional views of an exemplary PMOS metal gate stack device 100 according to one or more embodiments. Referring to FIG. 1A, device 100 comprises a substrate 110 whose surface is oxidized for form an interfacial layer 115. The substrate 110 may comprise any suitable material know to the skilled artisan. In some embodiments, the substrate 110 comprises silicon. The interfacial layer 115 may comprise any suitable material known to the skilled artisan. In one or more embodiments, the interfacial layer 115 comprises one or more of silicon dioxide, silicon germanium oxide ($SiGeO_x$), germanium oxide ($GeO_x$), or silicon oxynitride (SiON). In one or more specific embodiments, the interfacial layer 115 comprises silicon dioxide. In some embodiments, the substrate comprises additional electric elements and materials including but not limited to source regions, drain regions, conductive channels, and other electrical connectors.

Figure 1B:
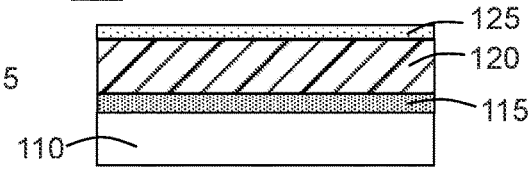

Referring to FIG. 1B, a high-κ metal oxide layer 120 is formed on the metal gate stack device 100. The high-κ metal oxide layer 120 may comprise any suitable material known to the skilled artisan. In one or more embodiments, the high-κ metal oxide layer 120 comprises one or more of hafnium oxide ($HfO_2$), hafnium oxynitride (HfON), hafnium zirconium oxide (HfZrO), hafnium zirconium oxynitride (HfZrON), hafnium silicon oxide (HfSiO), and hafnium silicon oxynitride (HfSiON). In one or more specific embodiments, the high-κ metal oxide layer 120 comprises hafnium oxide ($HfO_2$).

In one or more embodiments, a dipole film 125 is formed on the high-κ metal oxide layer 120. The dipole film 125 may comprise any suitable material known to the skilled artisan. In one or more embodiments, the dipole film 125 comprises a nitride, a carbide, an oxide, a carbonitride, or combinations thereof of a dipole metal. In one or more embodiments, the dipole metal comprises zinc (Zn), vanadium (V), tungsten (W), molybdenum (Mo), ruthenium (Ru), titanium (Ti), tantalum (Ta), zirconium (Zr), aluminum (Al), niobium (Nb), or mixtures thereof. In one or more embodiments, the dipole film 125 comprises niobium nitride (NbN). In other embodiments, the dipole film 125 comprises titanium aluminum nitride (TiAlN).

Figure 1C:
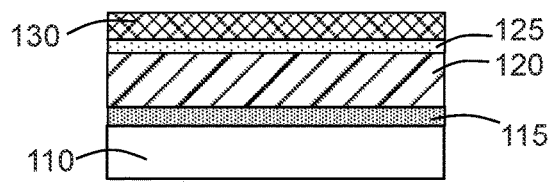

With reference to FIG. 1C, a capping layer 130 is formed on the dipole film 125. The dipole film 125 is on the high-κ metal oxide layer 120 adjacent to the capping layer 130.

The high-κ metal oxide layer 120 and metal gate work function layer 140 together may be referred to herein as a metal gate stack.

The capping layer 130 may comprise any suitable material known to the skilled artisan. In some embodiments, the capping layer 130 comprises or consists essentially of titanium nitride (TiN). In some embodiments, the capping layer 130 comprises or consists essentially of titanium silicon nitride (TiSiN). As used in this regard, "consists essentially of" means that the stated elements compose greater than 95%, greater than 98%, greater than 99% or greater than 99.5% of the stated material on an atomic basis. For the avoidance of doubt, no stoichiometric ratios are implied by the identification of materials disclosed herein. For example, a TiN material contains titanium and nitrogen. These elements may or may not be present at a 1:1 ratio.

The capping layer 130 may have any suitable thickness. In some embodiments, the thickness of the capping layer 130 is in a range of from greater than or equal to 5 Å to less than or equal to 25 Å. In some embodiments, the thickness of the capping layer 130 is about 10 Å, which includes 10 Å±10%, 10 Å±5%, and/or 10 Å±1%.

Figure 1D:
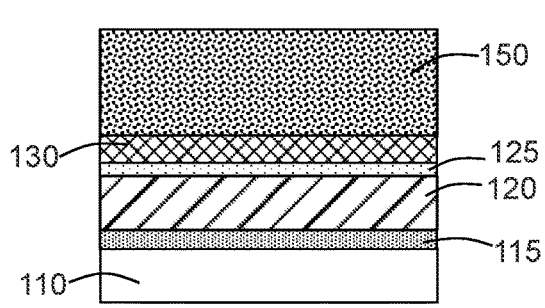

With reference to FIG. 1D, in one or more embodiments, a sacrificial sealing layer 150 is formed on the metal gate stack device 100. In one or more embodiments, the sacrificial sealing layer 150 is formed on the PMOS work function material 140. The sacrificial sealing layer 150 may comprise any suitable material known to the skilled artisan. In one or more embodiments, the sacrificial sealing layer 150 comprises amorphous silicon (a-Si).

The sacrificial sealing layer 150 may have any suitable thickness. In one or more embodiments, the sacrificial seal layer 150 has a thickness in a range of from 5 Å to 50 Å, including a range of from 10 Å to 40 Å.

Figure 1E:
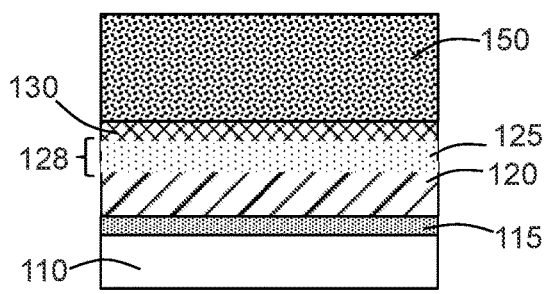

Referring to FIG. 1E, the metal gate stack device 100 is thermally treated to drive the dipole film 125 into the high-κ metal oxide layer 120 and to form a dipole region 128 in the high-κ metal oxide layer 120. Thermal treatment is performed to cause the dopant species, e.g., zinc (Zn), vanadium (V), tungsten (W), molybdenum (Mo), ruthenium (Ru), titanium (Ti), tantalum (Ta), zirconium (Zr), aluminum (Al), niobium (Nb), or mixtures thereof, to diffuse into the underlying high-κ gate metal oxide layer 120.

Equivalent oxide thickness (EOT) provides a characteristic of the interfacial layer and the high-κ layer. In one or more embodiments, a metal gate stack comprising a sacrificial sealing layer 150 has an EOT increase that is less than or equal to ~0.2 Å relative to a comparative metal gate stack without a sacrificial sealing layer. When a sacrificial sealing layer is not present, the gate stack with the dipole region 128 has an EOT of about 10.0-10.5 Å. In embodiments where a sacrificial sealing layer is deposited, the gate stack with the dipole region 128 as an EOT in a range of from about 8.6 Å to less than 9 Å.

Figure 1F:
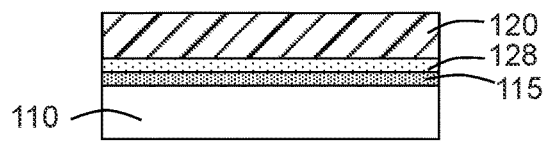
Figure 1G:
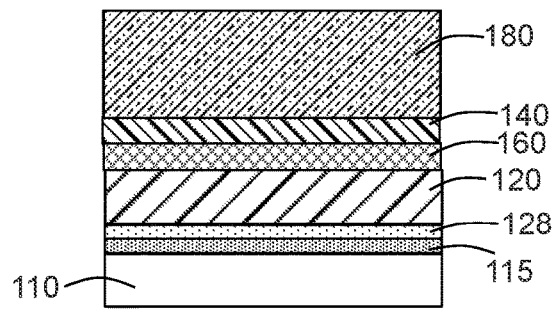

Referring to FIG. 1F, after driving the dopant of the dipole film 125 into the high-κ metal oxide layer 120 to form a dipole region 128, the sacrificial sealing layer 150 is removed, followed by removal of the capping layer 130. The result is a device 100 with a high-κ metal oxide layer 120 with a dipole region 128 on an interfacial layer 115 on a substrate 110.

Referring to 1G, in some embodiments, a second capping layer 160, e.g., a high-κ metal oxide capping layer, may be formed on the substrate, and a metal gate work function layer 140 is formed on the second capping layer 160. In other embodiments, the second capping layer 160 is not present. As used herein, the metal gate work function layer 140 may also be referred to as a "PMOS work function material".

The high-κ metal oxide layer 120 electrically insulates the metal gate work function layer 140 from the substrate 110. The high-κ metal oxide layer 120 and metal gate work function layer 140 together may be referred to herein as a high-κ metal gate stack.

The PMOS work function material 140 may comprise any suitable material. The PMOS work function material 140 may have any suitable thickness. In some embodiments, the thickness of the PMOS work function material 140 is in a range of greater than or equal to 5 Å to less than or equal to 50 Å. In some embodiments, the thickness of the metal gate work function layer is about 15 Å, which includes 15 Å±10%, 15 Å±5%, and/or 15 Å±1%. In some embodiments, the thickness of the metal gate work function layer is about 25 Å, which includes 25 Å±10%, 25 Å±5%, and/or 25 Å±1%. In other embodiments, the thickness of the metal gate work function layer is about 40 Å, which includes 40 Å±10%, 40 Å±5%, and/or 40 Å±1%.

In some embodiments, the metal gate stack device 100 further comprises a gate electrode 180. The gate electrode 180 may comprise multiple layers. In some embodiments, the gate electrode 180 comprises a first layer comprising TiAl and a second layer comprising TiN. In some embodiments, the first layer has a thickness of greater than or equal to 20 Å to less than or equal to 50 Å. In some embodiments, the first layer has a thickness of about 25 Å, which includes 25 Å±10%. In some embodiments, the first layer has a thickness of about 40 Å, which includes 40 Å±10%. In some embodiments, the second layer has a thickness of about 500 Å, which includes 500 Å±10%, 500 Å±5%, and/or 500 Å±1%. The first layer and the second layer may be deposited by any suitable method.

Figure 2:
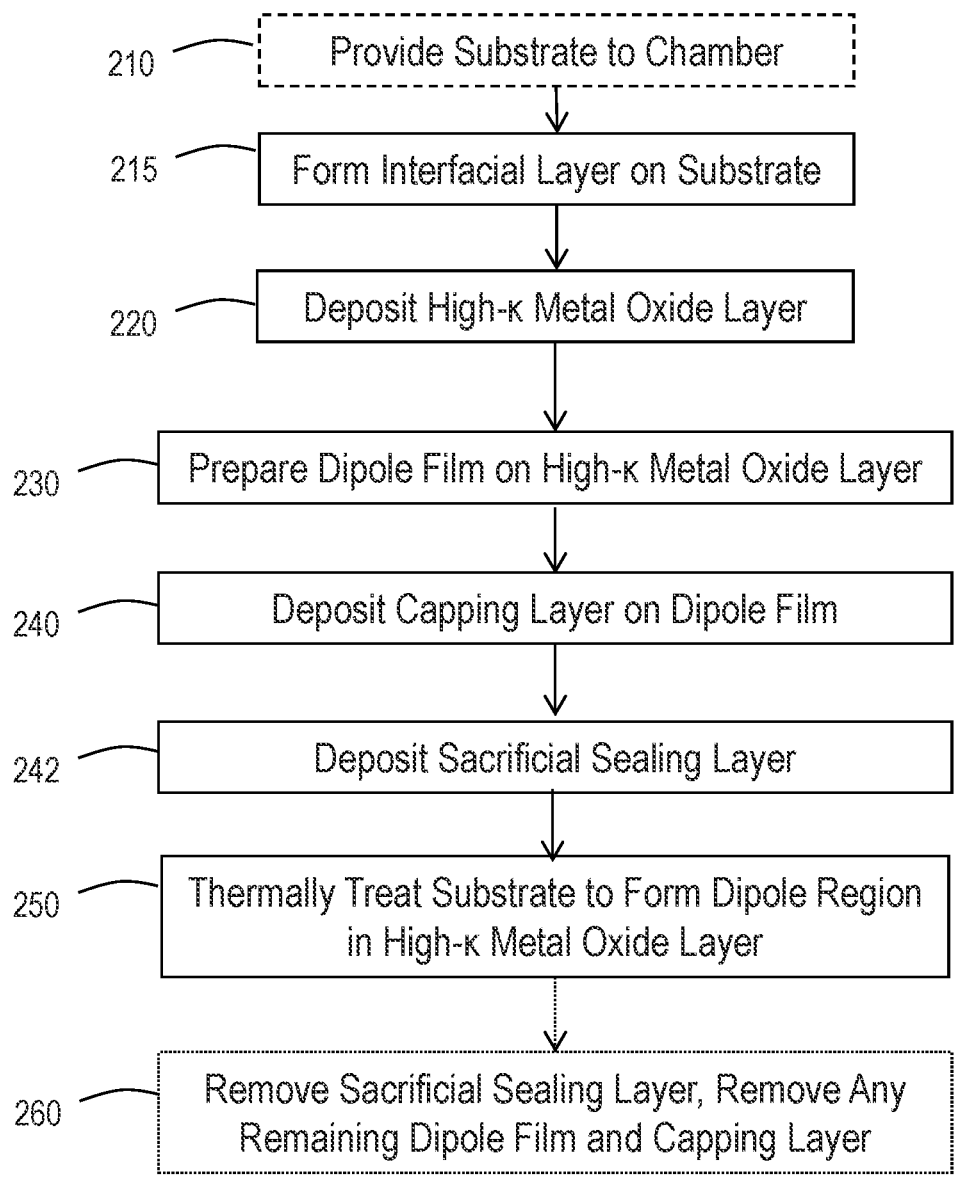
FIG. 2 is a flowchart of a method of forming a dipole region in accordance with one or more embodiments of the disclosure.

Referring to FIG. 2, another embodiment of the disclosure relates to a method 200 of forming a gate stack. The method 200 starts at operation 210 by optionally providing a substrate to a processing chamber.

At operation 215, an interfacial layer is formed on the substrate. Formation of the interfacial layer may include a suitable thermal oxidation process, such as an enhanced in situ steam generation (eISSG) process utilizing nitrous oxide ($N_2O$) gas. In one or more embodiments, the interfacial layer (e.g., 115 of FIG. 1) is a thin amorphous silicon oxide ($SiO_2$) layer, having a thickness of between about 3 Å and about 10 Å, for example, about 5 Å, corresponding to one or more monolayers of silicon oxide. In some embodiments, the interfacial layer may be formed by an in situ steam generation (ISSG) process utilizing $H_2$ and $O_2$ gases, or by a rapid thermal oxidation (RTO) process utilizing $NH_3$ and $O_2$ gases, or by a wet chemical oxide process (e.g., Standard Clean 1 (SC1) solution including $NH_4OH$ (ammonium hydroxide), $H_2O_2$ (hydrogen peroxide), and $H_2O$ (water)), or an ozone ($O_3$) wet chemistry process. The interfacial layer may act as a nucleation layer of the high-κ gate dielectric layer (e.g., 120 of FIG. 1) to be deposited thereon.

At operation 220, a high-κ metal oxide layer is deposited on the interfacial layer. The high-κ gate metal oxide layer may be formed of high-κ dielectric material, such as hafnium dioxide ($HfO_2$), zirconium dioxide ($ZrO_2$), ytterbium oxide ($Y_2O_3$), aluminum oxide ($Al_2O_3$), ternary high-κ dielectric film with the third element doped into the existing metal oxide high-κ dielectric host material, such as HfZrO, HfLaOx, HfTiO. The deposition process may include an atomic layer deposition (ALD) process, in which a metal-containing precursor and an oxygen-containing precursor are alternately delivered to the interfacial layer. In some embodiments, the metal-containing precursor is purged prior to delivering the oxygen-containing precursor. The metal may be a transition metal, such as hafnium (Hf), zirconium (Zr), or titanium (Ti), a rare-earth metal, such as lanthanum (La), ytterbium (Yb), or yttrium (Y), an alkaline earth metal, such as strontium (Sr), or other metal such as aluminum (Al). For the oxidant, any oxygen-containing precursor may be used that may react with the metal. For example, the oxygen-containing precursor may be or include water, diatomic oxygen, ozone, a hydroxyl-containing precursor or alcohol, nitrogen-and-oxygen-containing precursors, plasma-enhanced oxygen including locally or remotely enhanced oxygen, or any other material including oxygen that may be incorporated with the metal to produce a layer of an oxide of the metal over the interfacial layer. In one example, the metal-containing precursor is hafnium tetrachloride ($HfCl_4$) and the oxidant is water ($H_2O$) to form a hafnium dioxide ($HfO_2$) layer. The ALD process may be performed at a temperature of between 200° C. and about 400° C., for example, about 270° C. The metal oxide layer, as deposited by the ALD process, may be amorphous and have a thickness of between about 10 Å and about 30 Å.

Beginning at operation 230, the substrate is not removed from the processing chamber. The system is integrated such that the substrate is not exposed to an atmosphere containing moisture, water ($H_2O$), or oxygen ($O_2$). At operation 230, a dipole film is prepared on the high-κ metal oxide layer. In one or more embodiments, the dipole film comprises a nitride, a carbide, an oxide, a carbonitride, or combinations thereof of a dipole metal. In one or more embodiments, the dipole metal comprises: zinc (Zn), vanadium (V), tungsten (W), molybdenum (Mo), ruthenium (Ru), titanium (Ti), tantalum (Ta), zirconium (Zr), aluminum (Al), niobium (Nb), or mixtures thereof.

In one or more embodiments, the dipole film is one or more of a zinc-containing film, a vanadium-containing film, a tungsten-containing film, a molybdenum-containing film, a ruthenium-containing film, a tantalum-containing film, a titanium-containing film, a zirconium-containing film, an aluminum-containing film, or a niobium-containing film. The dipole film may be deposited by atomic layer deposition (ALD) at a substrate temperature in a range of 350° C. to 500° C. The ALD cycle may be repeated to obtain a dipole metal-containing film of a desired thickness, for example 5 Å to 10 Å. In some embodiments, deposition of the dipole film is conducted by a blanket deposition of the dipole film over the entire exposed surface of the high-κ gate dielectric layer, and a subsequent lithography and etch process to pattern the dipole film (i.e., to form the dipole film in some regions of the semiconductor structure, and not in some other regions of the semiconductor structure). In a subsequent thermal treatment (at operation 250), for example, an anneal process, dopant species from the dipole film, e.g., Zn, V, W, Mo, Ru, Ta, Ti, Al, Zr, or Nb are diffused and incorporated into the underlying high-κ gate dielectric layer to form a dipole region.

In one or more embodiments, the dipole film is prepared on the high-κ metal oxide layer by exposing the surface of the substrate to a first precursor comprising the dipole metal and optionally to a second precursor comprising nitrogen, oxygen, or carbon using atomic layer deposition at a first substrate temperature in a range of 350° C. to 500° C. In general, any suitable dipole metal precursor can be used. For a NbN film, for example, niobium precursors can include, but are not limited to $NbCl_5$, $NbB_5$, $NbBr_5$, $NbI_5$, $NbF_5$, organic-niobium compounds, and combinations thereof.

In one or more embodiments, the second precursors can include but are not limited to: $NH_3$, $N_2$, $N_2H_2$, $N_2H_4$, nitrogen-containing plasma, and combinations thereof.

In one or more embodiments, the second precursor comprises a second compound selected from the group consisting of $H_2O$, $H_2O_2$, $O_3$, ethanol, and combinations thereof. In one or more embodiments, the second precursor comprises a second compound selected from the group consisting of: $CH_4$, ethanol, and $H_2$. In one or more embodiments, the second precursor comprises a combination of two or more second compounds selected from the group consisting of: $NH_3$, $CH_4$, ethanol, $H_2$.

At operation 240, a capping layer is deposited on the dipole film. In one or more embodiments, the capping layer is deposited by atomic layer deposition (ALD). In one or more embodiments, the capping layer comprises titanium nitride (TiN). An exemplary process for depositing TiN includes exposing the substrate to a first precursor comprising Ti, and then to a second precursor comprising a nitrogen source to provide a TiN film. In some embodiments, the substrate is exposed to the precursors repeatedly to obtain a predetermined film thickness. In some embodiments, the substrate is maintained a temperature of about 200° C. to about 700° C. during the ALD process.

At operation 245, a sacrificial sealing layer is deposited onto the substrate. In one or more embodiments, sacrificial sealing layer comprises an amorphous silicon (a-Si) material. The sacrificial sealing layer may physically and chemically protect the underlying high-κ metal oxide layer and the first capping layer during a subsequent thermal treatment process at operation 250. The sacrificial sealing layer may be formed of amorphous silicon, such as hydrogenated amorphous silicon (a-Si:H). Amorphous silicon may provide less diffusion of atoms as compared to polycrystalline silicon which include grain boundaries leading path for diffusion.

The sacrificial sealing layer may be formed by an atomic layer deposition (ALD) process or a chemical vapor deposition (CVD) process, in which the semiconductor structure having the first capping layer formed thereon is exposed to a silicon precursor. Examples of the silicon precursors are poly-silanes ($Si_xH_y$). For example, poly-silanes include disilane ($Si_2H_6$), trisilane ($Si_3H_8$), tetrasilane ($Si_4H_{10}$), iso-tetrasilane, neopentasilane ($Si_5H_{12}$), cyclopentasilane ($Si_5H_{10}$), hexasilane ($C_6H_{14}$), cyclohexasilane ($Si_6H_{12}$) or, in general, $Si_xH_y$ with x=2 or more, and combinations thereof. The sacrificial sealing layer may have a thickness of between about 5 Å and about 50 Å.

At operation 250, the substrate is thermally-treated to drive the dipole film into the high-κ metal oxide layer and to form a dipole region in the high-κ metal oxide layer. Thermal treatment is performed to cause the dipole metal dopant species, e.g., Zn, V, W, Mo, Ru, Ta, Ti, Zr, Al, or Nb, or mixtures thereof, to diffuse into the underlying high-κ gate metal oxide layer. In one or more embodiments, the thermal treatment of operation 250 comprises a post cap anneal (PCA) process, which is performed to harden and densify the first capping layer. Crystallization of the as-deposited first capping layer and any as-deposited sacrificial silicon cap layer may occur. The PCA process may comprise an anneal process. The anneal process may include a thermal anneal process in an inert ambient, such as in a nitrogen ($N_2$) and argon (Ar) ambient, performed in a rapid thermal processing (RTP) chamber, such as RADOX™ chamber, available from Applied Materials, Inc., located in Santa Clara, Calif.

The thermal treatment of operation 250 may be performed for between about 1 second and about 30 seconds, at a temperature of between about 600° C. and about 1000° C., for example, about 900° C. and at a pressure of between about 0.1 Torr and 100 Torr.

At operation 260, the substrate may be removed from the processing chamber and may be exposed to moisture, water, or oxygen. According to one or more embodiments, at operation 260, the sacrificial sealing layer, and any remaining portion of the dipole film along with the capping layer is removed. The removal process may include a dry plasma etch process. The resulting structure including a high-κ metal oxide layer with a doped region can then be further processed to fit desired applications.

Aspects herein comprise: a method of forming a metal gate stack, the method comprising: preparing an interfacial layer on a surface of a substrate; depositing a high-κ metal oxide layer on the interfacial layer; preparing a dipole film on the high-κ metal oxide layer by exposing the surface of the substrate to a first precursor comprising a dipole metal, e.g., zinc (Zn), vanadium (V), tungsten (W), molybdenum (Mo), ruthenium (Ru), titanium (Ti), tantalum (Ta), zirconium (Zr), aluminum (Al), niobium (Nb), or mixtures thereof, and optionally to a second precursor comprising nitrogen, oxygen, or carbon using atomic layer deposition at a first substrate temperature in a range of 350° C. to 500° C.; depositing a first capping layer on the substrate; depositing an amorphous silicon layer on the substrate; and exposing the substrate to a thermal treatment at a second substrate temperature of at least 700° C. to drive the dipole film into the high-κ metal oxide layer and to form the dipole region comprising a dipole metal adjacent to the interfacial layer.

In one or more embodiments, the method further comprises removing the sacrificial sealing layer, removing any remaining portion of the dipole film, and removing the first capping layer.

Figure 3:
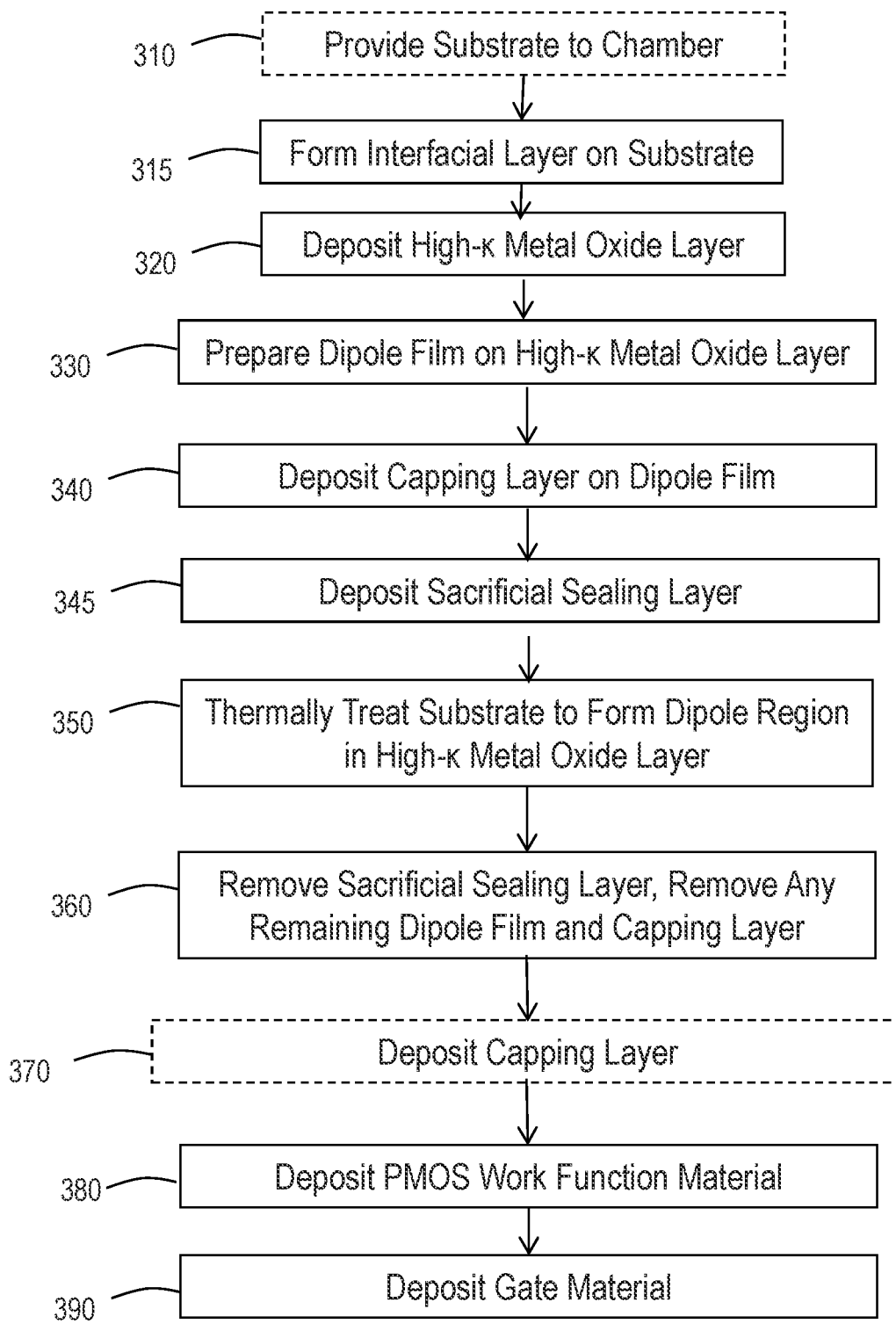
FIG. 3 is a flowchart of a method for forming a metal gate stack according to FIG. 1 in accordance with one or more embodiments of the disclosure.

Referring to FIG. 3, another embodiment of the disclosure relates to a method 300 of forming metal gate stack device. The method 300 starts at 310 by optionally providing a substrate within a first processing chamber. At operation 315, an interfacial layer is formed on the substrate, and is in accordance with operation 215 discussed with respect to FIG. 2. At operation 320, a high-κ metal oxide layer is deposited on the interfacial layer and is in accordance with operation 220 discussed with respect to FIG. 2. At operation 330, a dipole film is prepared on the high-κ metal oxide layer and is in accordance with operation 230 discussed with respect to FIG. 2. At operation 340, a capping layer is deposited on the dipole film, and is in accordance with operation 240 discussed with respect to FIG. 2.

In one or more embodiments, the capping layer is deposited on the dipole film in situ, in that the same processing (first) chamber is used for both operations 330 and 340.

At operation 345, a sacrificial sealing layer is deposited onto the substrate, and is in accordance with operation 245 discussed with respect to FIG. 2. In one or more embodiments, the sacrificial sealing layer comprises an amorphous silicon (a-Si) material.

At operation 350, the substrate is thermally treated to drive the dipole film into the high-κ metal oxide layer and to form a dipole region in the high-κ metal oxide layer.

After deposition of the thermally treating the substrate, according to one or more embodiments, the substrate may be transferred to a different (second) processing chamber for operation 360. In some embodiments, the first processing chamber and the second processing chamber are integrated. In some embodiments, the method 300 is performed without breaking vacuum or without exposure to ambient air.

At operation 360, the sacrificial sealing layer and any remaining portion of the dipole film along with the capping layer is removed. Thereafter at operation 370, another (second) capping layer may be deposited on the high-κ metal oxide layer. In some embodiments, depositing a second capping layer is optional. At operation 380, PMOS work function material may be deposited on the second capping layer or on the high-κ metal oxide layer if the capping layer is not present. At operation 390, a gate material is deposited on the PMOS work function material.

Many precursors are within the scope of the invention. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos, and anilides. Precursors can be comprised of organometallic and inorganic/halide compounds.

In general, any suitable titanium precursor can be used for the capping layer. Thus, titanium precursors can include, but are not limited to $TiCl_4$, $TiBr_4$, $TiI_4$, $TiF_4$, tetrakisdimethylamino titanium. Additionally, any suitable nitrogen source precursor can be used. Examples include, but are not limited to, nitrogen gas, ammonia gas, $N_2H_2$ or $N_2H_4$.

Aspects herein are directed to a method of manufacturing a metal gate stack, the method comprising: preparing an interfacial layer on a surface of a substrate in a first processing chamber; depositing a high-κ metal oxide layer on the interfacial layer within the first processing chamber; preparing a dipole film on the high-κ metal oxide layer by exposing the surface of the substrate to a first precursor comprising a dipole metal, e.g., zinc (Zn), vanadium (V), tungsten (W), molybdenum (Mo), ruthenium (Ru), titanium (Ti), tantalum (Ta), zirconium (Zr), aluminum (Al), niobium (Nb), or mixtures thereof, and optionally to a second precursor comprising nitrogen, oxygen, or carbon within the first processing chamber using atomic layer deposition at a first substrate temperature in a range of 350° C. to 500° C.; depositing a first capping layer on the substrate within the first processing chamber; forming a sacrificial sealing layer on the substrate; exposing the substrate to a thermal treatment at a second substrate temperature in a range of 700° C. to 1050° C. to drive the dipole film into the high-κ metal oxide layer and to form a dipole region comprising a dipole metal, e.g., Zn, V, W, Mo, Ru, Ta, Ti, Zr, or Nb, adjacent to the interfacial layer; transferring the substrate to a second processing chamber; and removing the sacrificial sealing layer, removing the first capping layer, and removing any remaining portion of the dipole film.

In one or more embodiments, the method further comprises depositing a second capping layer on the substrate.

In one or more embodiments, the method further comprises depositing a PMOS work function material on the substrate.

In one or more embodiments, the method further comprises depositing a gate material on the substrate.

In one or more embodiments, the first capping layer comprises titanium nitride (TiN), the high-κ metal oxide layer comprises hafnium oxide ($HfO_2$), and the interfacial layer comprises silicon dioxide ($SiO_2$).

In one or more embodiments, the method further comprises the second capping layer comprises TiN.

In one or more embodiments, preparing the interfacial layer comprises oxidizing the surface of the substrate before depositing the high-κ metal oxide layer.

The order in which the substrate is exposed to the precursors can be varied. The exposures may repeat in a deposition cycle. Further, exposure to a precursor may be repeated within a single deposition cycle.

Methods of this disclosure can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, a suitable processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation, and other substrate processes. By carrying out processes in a chamber on a cluster tool, surface contamination of the substrate with atmospheric impurities can be avoided without oxidation prior to depositing a subsequent film.

In some embodiments, the first processing chamber and the second processing chamber are part of the same, clustered, processing tool. Accordingly, in some embodiments, the method is an in situ integrated method.

In some embodiments, the first processing chamber and the second processing chamber are different processing tools. Accordingly, in some embodiments, the method is an ex-situ integrated method.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, and/or cleaning processes throughout the carousel path.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Figure 4:
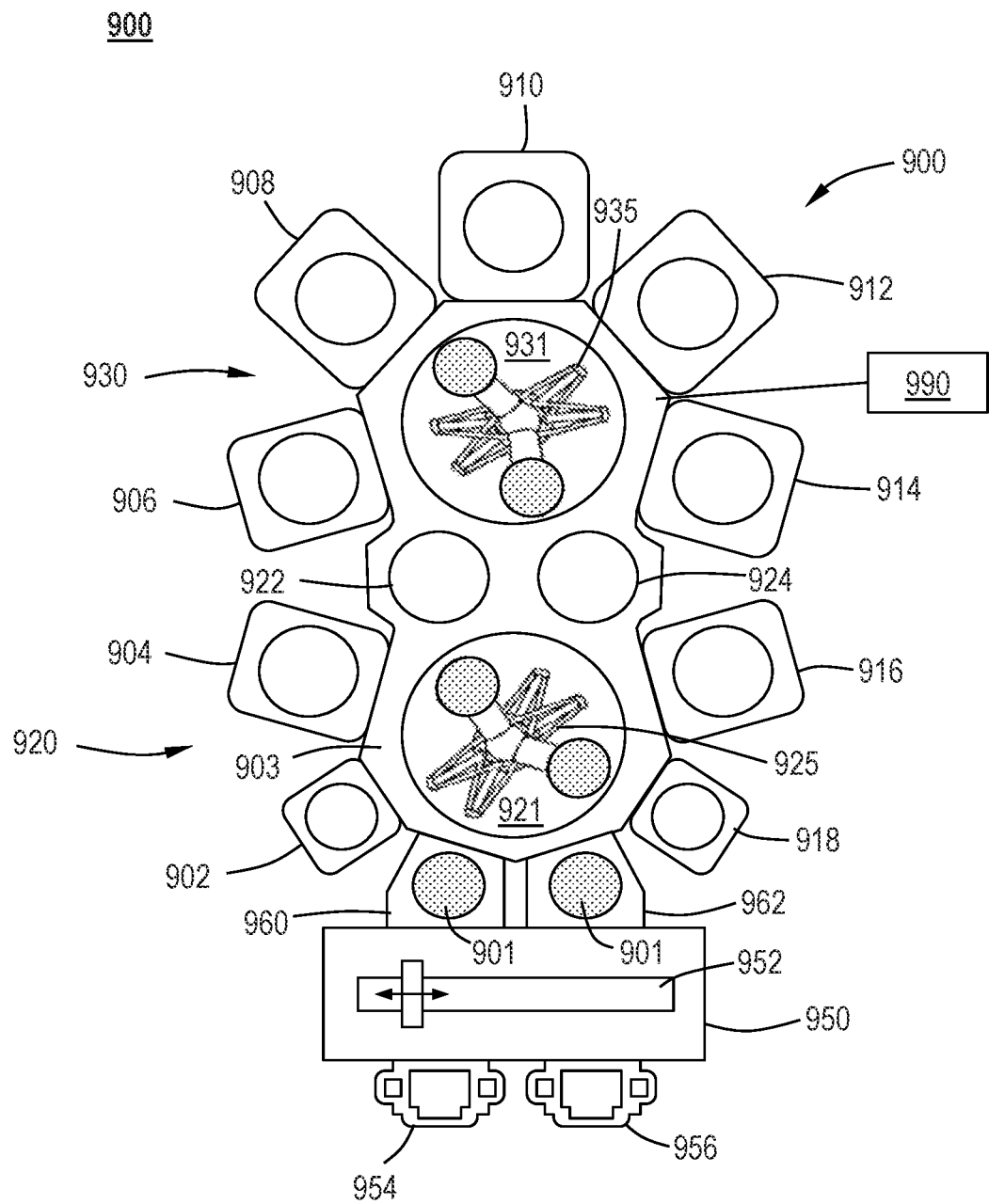
FIG. 4 is a cluster tool accordance with one or more embodiments of the disclosure.

With reference to FIG. 4, additional embodiments of the disclosure are directed to processing tools 900 that can be used with the processing chamber of one or more embodiments to perform the methods described.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cooling chamber, a deposition chamber, annealing chamber, etching chamber, a thermal processing (RTP) chamber, a plasma oxidation chamber, a plasma nitridation chamber, an atomic layer deposition (ALD) chamber. The particular arrangement of process chambers and components can be varied depending on the cluster tool and should not be taken as limiting the scope of the disclosure.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

The controller 990 of some embodiments has one or more configurations selected from: a configuration to move a substrate on the robot between the plurality of processing chambers and metrology station; a configuration to load and/or unload substrates from the system; a configuration to form an interfacial layer on a surface of a substrate; a configuration to deposit a high-κ metal oxide layer; a configuration to deposit a dipole-metal (e.g., zinc (Zn), vanadium (V), tungsten (W), molybdenum (Mo), ruthenium (Ru), titanium (Ti), tantalum (Ta), zirconium (Zr), aluminum (Al), niobium (Nb), or mixtures thereof) film; a configuration to deposit a first capping layer; a configuration to deposit a sacrificial sealing layer; a configuration to thermally treat the substrate and drive the dipole-containing film into the high-κ metal oxide layer; a configuration to remove the sacrificial sealing layer; a configuration to remove any remaining dipole-containing film; a configuration to remove the first capping layer; a configuration to deposit a second capping layer; a configuration to deposit a PMOS work function material; and/or a configuration to deposit a gate electrode.

In one or more embodiments, a first processing chamber 910 can be configured for thermal oxidation to form an interfacial layer on the substrate. The substrate can be moved to and from the processing chamber 910 by the robot 931 passing through pass through 922.

Processing chamber 908 can also be connected to the transfer station 931. In some embodiments, processing chamber 908 comprises an atomic layer deposition chamber for depositing a high-κ gate metal oxide layer and is fluid communication with one or more reactive gas sources to provide flows of reactive gas to the processing chamber 908. In some embodiments, processing chamber 906 comprises an atomic layer deposition chamber for depositing a sacrificial sealing layer and is fluid communication with one or more reactive gas sources to provide flows of reactive gas to the processing chamber 906. In some embodiments, processing chamber 906 comprises an atomic layer deposition chamber for depositing a dipole film and is fluid communication with one or more reactive gas sources to provide flows of reactive gas to the processing chamber 906. In some embodiments, processing chamber 908 comprises an atomic layer deposition chamber for depositing a high-κ gate metal oxide capping layer and is fluid communication with one or more reactive gas sources to provide flows of reactive gas to the processing chamber 908. The substrate can be moved to and from the processing chamber 908 by robot 931.

In some embodiments, processing chamber 904 is connected to the transfer station 921 and is configured to thermally treat the substrate.

In some embodiments, other processing chambers may be configured to perform further portions of the processing method including removing the sacrificial sealing layer, removing any remaining dipole film, and removing the first capping layer; depositing the second high-κ capping layer; depositing the PMOS work function material; depositing gate electrode material. The skilled artisan will recognize that the number and arrangement of individual processing chamber on the tool can be varied, and that the embodiment illustrated in FIG. 4 is merely representative of one possible configuration.

In some embodiments, the processing system 900 includes one or more metrology stations. For example, metrology stations can be located within the transfer stations 931, 921 or within any of the individual processing chambers. The metrology station can be any position within the system 900 that allows the distance of the recess to be measured without exposing the substrate to an oxidizing environment.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a metal gate stack, the method comprising:
   forming an interfacial layer on a surface of a substrate;
   depositing a high-κ metal oxide layer on the interfacial layer;
   forming a dipole film on the high-k metal oxide layer;
   depositing a first capping layer on the substrate;
   forming a sacrificial sealing layer on the first capping layer;
   exposing the substrate to a thermal treatment at a temperature of at least 700° C. to drive the dipole film into the high-κ metal oxide layer and to form a dipole region on the metal gate stack, wherein the metal gate stack has an equivalent oxide thickness (EOT) increase that is less than or equal to 0.2 Å relative to a metal gate stack having no sacrificial sealing layer thereon; and
   removing the sacrificial sealing layer.

2. The method of claim 1, wherein the sacrificial sealing layer comprises amorphous silicon (a-Si).

3. The method of claim 1, wherein the sacrificial sealing layer has a thickness in a range of from 5 Å to 50 Å.

4. The method of claim 1, wherein the dipole film comprises a nitride, a carbide, an oxide, a carbonitride, or combinations thereof of a dipole metal.

5. The method of claim 4, wherein the dipole metal comprises zinc (Zn), vanadium (V), tungsten (W), molybdenum (Mo), ruthenium (Ru), titanium (Ti), tantalum (Ta), zirconium (Zr), aluminum (Al), niobium (Nb), or mixtures thereof.

6. The method of claim 1, further comprising removing any remaining portion of the dipole film, and the first capping layer.

7. The method of claim 6, further comprising depositing a second capping layer on the substrate.

8. The method of claim 7, further comprising depositing a PMOS work function material on the substrate.

9. The method of claim 8, further comprising depositing a gate material on the substrate.

10. The method of claim 1, wherein the first capping layer comprises titanium nitride (TiN) or titanium silicon nitride (TiSiN).

11. The method of claim 1, wherein the high-k metal oxide layer comprises one or more of hafnium oxide ($HfO_2$), hafnium oxynitride (HfON), hafnium zirconium oxide (HfZrO), hafnium zirconium oxynitride (HfZrON), hafnium silicon oxide (HfSiO), and hafnium silicon oxynitride (HfSiON).

12. The method of claim 1, wherein the interfacial layer comprises one or more of silicon dioxide ($SiO_2$), silicon germanium oxide ($SiGeO_x$), germanium oxide ($GeO_x$), or silicon oxynitride (SiON).

13. A method of scavenging oxidants from a metal gate stack, the method comprising:
   forming a sacrificial sealing layer on the metal gate stack, the metal gate stack comprising a first capping layer on a dipole film on high-k metal oxide layer on an interfacial layer on a surface of a substrate;
   exposing the metal gate stack to a thermal treatment at a temperature of at least 700° C. to drive the dipole film into the high-κ metal oxide layer and to form a dipole region, wherein the metal gate stack has an equivalent oxide thickness (EOT) increase that is less than or equal to 0.2 Å relative to a metal gate stack having no sacrificial sealing layer thereon; and
   removing the sacrificial sealing layer.

14. The method of claim 13, wherein the sacrificial sealing layer comprises amorphous silicon (a-Si).

15. The method of claim 13, wherein the sacrificial sealing layer has a thickness in a range of from 5 Å to 50 Å.

16. The method of claim 13, further comprising removing any remaining portion of the dipole film, and the first capping layer.

17. The method of claim 13, further comprising depositing a second capping layer on the substrate.

18. The method of claim 17, further comprising depositing a PMOS work function material on the substrate.

19. The method of claim 18, further comprising depositing a gate material on the substrate.

* * * * *